US007760799B2

(12) United States Patent
Lai et al.

(10) Patent No.: US 7,760,799 B2
(45) Date of Patent: Jul. 20, 2010

(54) PROGRAMMABLE DIGITAL EQUALIZATION CONTROL CIRCUITRY AND METHODS

(75) Inventors: Tin H. Lai, San Jose, CA (US); Sergey Shumarayev, San Leandro, CA (US); Simardeep Maangat, Sunnyvale, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 694 days.

(21) Appl. No.: 11/238,365

(22) Filed: Sep. 28, 2005

(65) Prior Publication Data

US 2007/0071084 A1  Mar. 29, 2007

(51) Int. Cl.
  *H03H 7/30* (2006.01)
  *H03H 7/40* (2006.01)
  *H03K 5/159* (2006.01)
(52) U.S. Cl. .................... 375/233; 375/229; 375/345
(58) Field of Classification Search ................ 375/229, 375/318, 345, 317, 316; 333/18, 28; 381/103; 708/323
  See application file for complete search history.

(56) References Cited

U.S. PATENT DOCUMENTS

| 4,066,977 | A * | 1/1978 | Chambers et al. ........... 330/129 |
| 4,667,179 | A | 5/1987 | Law et al. |
| 6,870,404 | B1 | 3/2005 | Maangat |
| 6,909,419 | B2 * | 6/2005 | Zavracky et al. ............ 345/102 |
| 2001/0023177 | A1 | 9/2001 | Tanaka |
| 2001/0027092 | A1 * | 10/2001 | Muschallik et al. ......... 455/260 |
| 2002/0158783 | A1 * | 10/2002 | Oh et al. ..................... 341/120 |
| 2004/0061502 | A1 * | 4/2004 | Hasser ........................ 324/332 |

(Continued)

FOREIGN PATENT DOCUMENTS

JP  61133713  6/1986

(Continued)

OTHER PUBLICATIONS

Choi, J.-S., et al., "A 0.18-µm CMOS 3.5-Gb/s Continuous-Time Adaptive Cable Equalizer Using Enhanced Low-Frequency Gain Control Method" *IEEE Journal of Solid-State Circuits*, (39)3:419-425 (Mar. 2004).

(Continued)

*Primary Examiner*—David C Payne
*Assistant Examiner*—Brian J Stevens
(74) *Attorney, Agent, or Firm*—Ropes & Gray LLP; Jeffrey H. Ingerman

(57) ABSTRACT

Equalization circuitry may be used to compensate for the attenuation of a data signal caused by a transmission medium. The control circuitry for the equalization circuitry may generate control inputs for equalization stages that control the amount of gain provided to the data signal. A comparator may determine whether the gain from the equalization circuitry is less than or more than the desired amount of gain. A programmable up/down counter may adjust the counter value based on the output of the comparator. The counter value may be converted into one or more analog voltages using one or more digital-to-analog converters. These analog voltages may be provided to the equalization stages as control inputs. The control circuitry may also include hysteresis circuitry that prevents the counter value from being adjusted when the gain produced by the equalization stages is close to the desired amount of gain.

23 Claims, 2 Drawing Sheets

U.S. PATENT DOCUMENTS

| | | |
|---|---|---|
| 2004/0178851 A1* | 9/2004 | Ishida et al. ............... 330/279 |
| 2004/0193966 A1* | 9/2004 | Hirabayashi ................ 714/54 |
| 2005/0095988 A1 | 5/2005 | Bereza et al. |
| 2005/0248382 A1* | 11/2005 | Chung et al. ............... 327/362 |
| 2006/0190210 A1* | 8/2006 | Mukherjee ................. 702/130 |
| 2007/0014344 A1 | 1/2007 | Maangat et al. |

FOREIGN PATENT DOCUMENTS

| | | |
|---|---|---|
| SU | 1658378 | 6/1991 |
| WO | WO 97/36372 | 10/1997 |
| WO | WO 02/05423 | 1/2002 |

OTHER PUBLICATIONS

"Least Mean Squares Filter," http://en.wikipedia.org/wiki/Least_mean_squares_filter, last modified Feb. 21, 2008, accessed on Apr. 7, 2008.

* cited by examiner

PROGRAMMABLE DIGITAL EQUALIZATION CONTROL CIRCUITRY AND METHODS

BACKGROUND OF THE INVENTION

This invention relates to digital data communication, and more particularly to circuitry and methods for producing control inputs to adjust the amount of gain provided by equalization circuitry.

The equalization circuitry may be a component of a receiver configured to receive data signals transmitted by a driver over a transmission medium (e.g., a backplane). The equalization circuitry may provide gain to data signals to compensate for attenuation caused by the transmission medium.

The equalization circuitry may include equalization stages that are controlled by control inputs to determine the amount of gain provided to the data signal. Equalization circuitry and stages are discussed in greater detail in Maangat et al. U.S. patent application Ser. No. 11/182,658, filed Jul. 14, 2005, now U.S. Patent Publication No. 2007/0014344, which is hereby incorporated by reference herein in its entirety.

Traditionally, the control inputs for the equalization stages have been generated using analog circuitry, such as, comparators, charge pumps and capacitors. In particular, a comparator may determine whether the equalization stages are providing too much or too little gain by outputting a pulse. In response to receiving the pulse from the comparator, a charge pump may increase or decrease the voltage on a capacitor to adjust the control input for the equalization stages.

However, this approach has several downsides. One downside is that the charge pump has to provide charging/discharging current to maintain the voltage level on the capacitor. Therefore, it would be difficult to adjust the amount of gain in the equalization circuitry in precise increments because the charging/discharging action of the charge pump depends on the current values and the duration of the enable time pulses from the comparator, which are both difficult to control. Another downside is that current leakage from the capacitor increases jitter and the control input cannot be locked after the appropriate control input for the equalization circuitry has been determined. Hysteresis cannot be added to help reduce jitter in this analog approach because at optimum equalization, the capacitor charges 50% of the time and discharges 50% of the time.

SUMMARY OF THE INVENTION

Digital control circuitry may be used to determine control inputs for the equalization stages such that the equalization stages provide the attenuated data signal with a suitable amount of gain. The digital control circuitry may include a comparator, a programmable up/down counter, one or more digital-to-analog (D/A) converters, and hysteresis circuitry.

The comparator may compare the data signal with the output of the equalization stages and produce an output that indicates whether the equalization stages are providing the data signal with too much or too little gain.

The counter may adjust its counter value based on the output of the comparator. The counter value directly affects the amount of gain produced by the equalization stages. For example, if the comparator indicates that the equalization stages are providing too much gain, the counter may adjust the counter value such that the equalization stages provide less gain. In another example, if the comparator indicates that the equalization stages are not providing enough gain, the counter may adjust the counter value such that the equalization stages provide more gain.

The D/A converter may be configured to produce an analog voltage in fixed increments within the reference voltages. The counter value input into the D/A converter indicates the analog output that is produced. The analog voltage may be applied to one of the equalization stages as a control input. A separate D/A converter may be provided for each equalization stage.

The counter may include a state machine that determines a sequence for determining the control inputs for the equalization stages. In this approach, the state machine may provide the counter value to the D/A converters one at a time.

The resolution of the counter and the D/A converters may be programmable. For example, increasing the resolution of the counter and the D/A converters may allow the equalization circuitry to more precisely compensate for the attenuation of the data signal. In some embodiments, the state machine in the counter may adjust the resolution of the counter and/or the D/A converters to determine a more precise control input for the equalization stages.

The hysteresis circuitry may selectively provide a clock signal to the counter. The clock signal may determine how quickly the equalization circuitry is able to compensate for the attenuation of the data signal. The hysteresis circuitry may route the clock signal to the counter if the output of the comparator is stable (i.e., the output does not change for a certain number of cycles of the clock signal). The hysteresis circuitry may isolate the clock signal from the counter if the output of the comparator is unstable (i.e., the output changes values within a certain number of cycles of the clock signal). This is usually an indication that the equalization circuitry providing the data signal with approximately the amount of gain necessary to compensate for the attenuation of the data signal.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
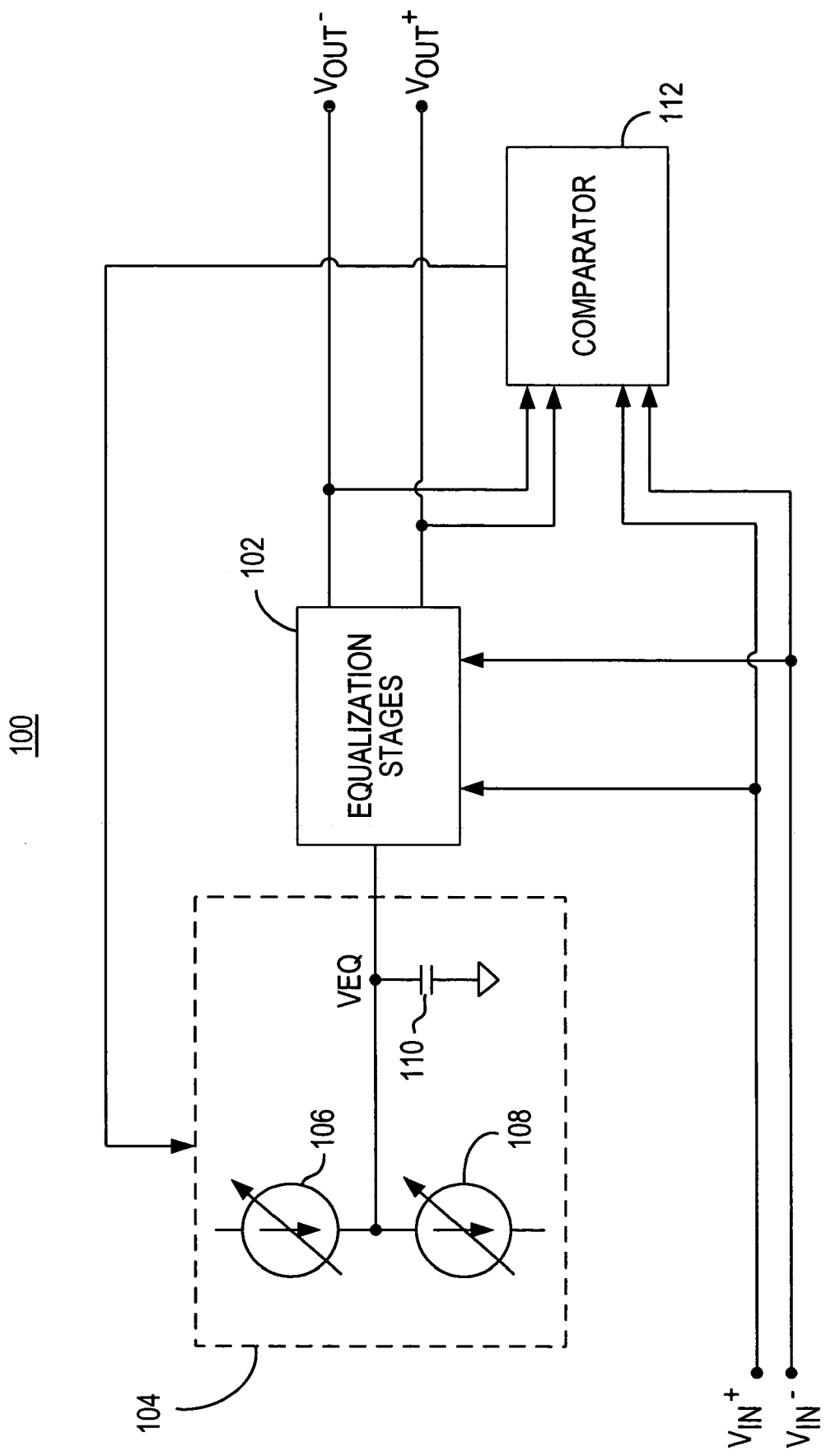
FIG. 1 is an illustrative circuit diagram of equalization circuitry with analog control in accordance with the prior art.

FIG. 1 is an illustrative circuit diagram of equalization circuitry 100 with analog control in accordance with the prior art. Equalization circuitry 100 may include equalization stages 102, analog control circuitry 104, and a comparator 112.

Equalization stages 102 may include any suitable number of stages, which may be connected in series. Equalization stages 102 will be discussed hereinbelow as having a single stage. Equalization stage 102 may process the data signal and provide the data signal with gain. Equalization stage 102 may produce gain by contributing a zero to its transfer function and the amount of gain may be controlled by a control input that indicates where the zero should be positioned. The control input may be determined using comparator 112 in a feedback loop with analog control circuitry 104.

Comparator 112 may compare the output of equalization stage 102 with the incoming data signal to determine if equalization stage 102 has provided the incoming data signal with enough gain to compensate for the attenuation of the data signal. For example, comparator 112 may determine if the energy of the output of equalization stage 112 is equal to the energy of incoming data signal plus an offset equal to the expected attenuation of the data signal. Comparator 112 may produce an output signal that indicates whether equalization stage 112 has provided too much gain or not enough gain to the incoming data signal. In some embodiments, the output of comparator 112 may be a pulse.

Analog control circuitry 104 may receive the output from comparator 112 to adjust the control input for equalization stage 102. Analog control circuitry 104 may include programmable current sources 106 and 108 and an integrating capacitor 110. In some embodiments, programmable current sources 106 and 108 and integrating capacitor 110 may be implemented together as a charge pump. Based on the output of comparator 112, analog control circuitry 104 may increase or decrease the control input, which in turn affects the amount of gain provided to the data signal by equalization stage 102. If the output of comparator 112 is a pulse, analog control circuitry 104 may adjust the gain provided by equalization stage 102 for the duration of the pulse.

The control input may be monotonically increasing or monotonically decreasing with the gain of equalization stage 102. For example, if comparator 112 indicates that the gain of equalization stage 102 should be increased, analog control circuitry 104 may increase the control input if it is monotonically increasing with the gain of equalization stage 102. In another example, if comparator 112 indicates that the gain of equalization stage 102 should be increased, analog control circuitry 104 may decrease the control input if it is monotonically decreasing with the gain of equalization stage 102.

Increasing the control input may be accomplished by increasing the current output of programmable current source 106 relative to the current output of programmable current source 108. Decreasing the control input may be accomplished by increasing the current output of programmable current source 108 relative to the current output of programmable current source 106.

Although equalization circuitry 100 is relatively simple to implement, there are downsides to using analog circuitry to control equalization stage 102. First, one of programmable current sources 106 and 108 must continually provide a current to maintain the charge on integrating capacitor 110. The amount of gain provided to the data signal cannot be precisely controlled because it is dependent on the current values and durations of the pulses produced by comparator 112, which are both difficult to control. Secondly, current leakage from capacitor 110 increases jitter and analog control circuitry 104 cannot be configured to lock the control input even after a suitable control input has been determined. Hysteresis cannot be added to help reduce jitter in this analog approach because at optimum equalization, the capacitor charges 50% of the time and discharges 50% of the time. The downsides to using analog control circuitry with equalization stages may be overcome by implementing digital control circuitry with equalization stages as described below.

Figure 2:
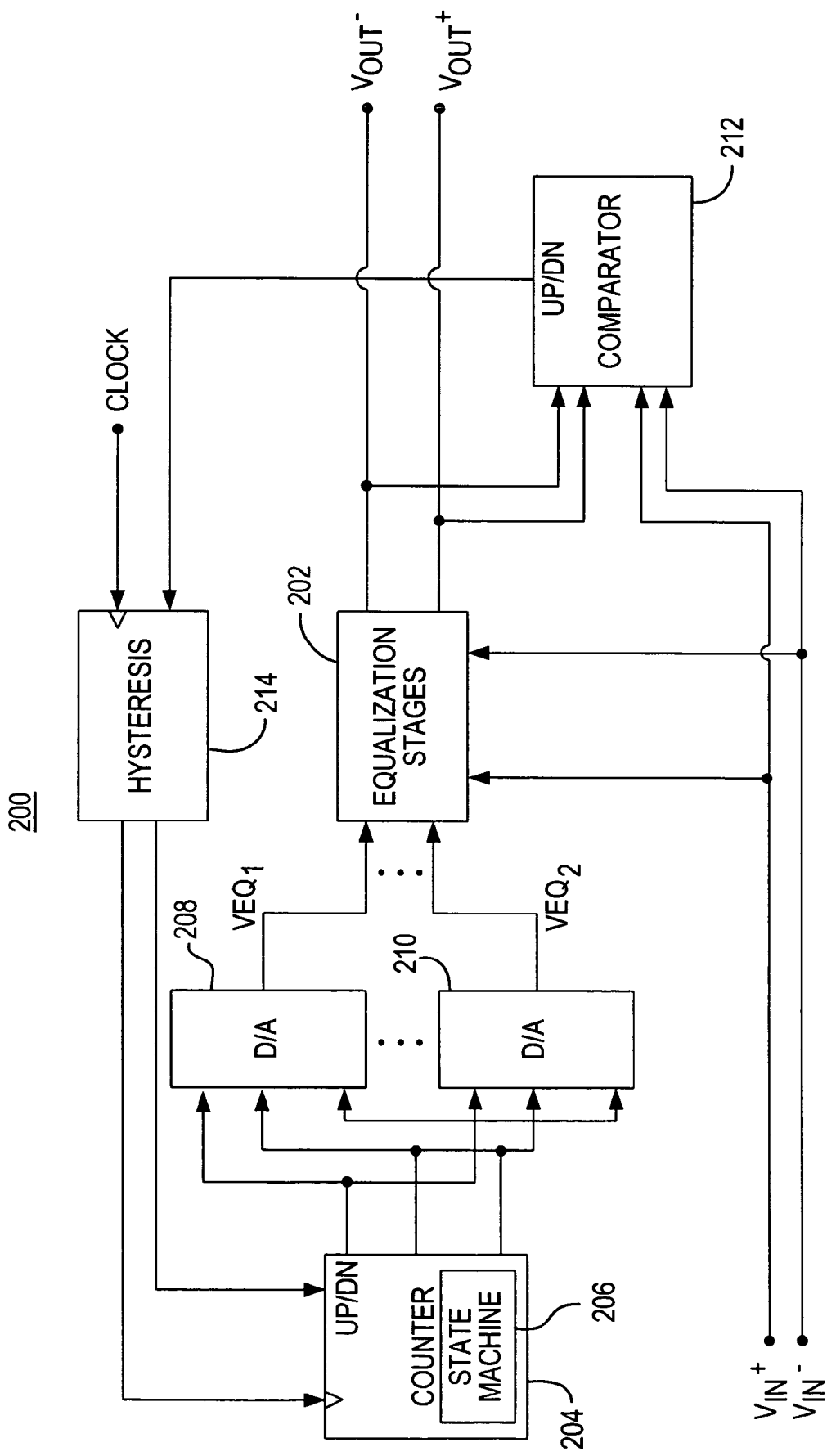
FIG. 2 is an illustrative circuit diagram of equalization circuitry with digital control in accordance with the present invention.

FIG. 2 is an illustrative circuit diagram of equalization circuitry 200 with digital control in accordance with the present invention. Equalization circuitry 200 may include equalization stages 202, counter 206, digital-to-analog (D/A) converters 208 and 210, a comparator 212, and hysteresis circuitry 214.

Equalization stages 202, which are similar to equalization stages 102 (FIG. 1), may produce a gain by inserting one or more zeros into a transfer function. The gain may be applied to an incoming data signal to compensate for the attenuation of the data signal. For the purposes of illustration and not limitation, equalization stages 202 will be discussed hereinbelow as having two stages. One skilled in the art should understand that equalization stages 202 may include any number of stages without departing from the scope of the present invention.

Each of equalization stages 202 may receive an analog control input that controls the position of the zero for that stage. In some embodiments, the positions of the zeros may be selected from different ranges to allow the zeros to be staggered across a wide range of frequencies. The control inputs for equalizing the data signal may be determined by implementing comparator 212 in a feedback loop with counter 204 and D/A converters 208 and 210.

Similar to comparator 112 (FIG. 1), comparator 212 may determine whether equalization stages 202 are providing enough gain to the data signal to compensate for attenuation of the data signal. In some embodiments, comparator 212 may include configurable RAM that may be configured by a user to store an offset that is equal to the expected amount of attenuation of the data signal. The offset may be used to determine whether equalization stages 202 are providing enough gain to the data signal. For example, the user may set the offset to be equal to 15 dB for 1 Gbps data signals. If comparator 212 determines that equalization stages 202 are not providing enough gain to the data signal, comparator 212 may output a signal that indicates whether equalization stages 202 should produce more gain or less gain.

The digital control circuitry may adjust the control inputs for equalization stages 202 such that equalization stages 202 produce more or less gain in accordance with the output of comparator 212. Counter 204 and D/A converters 208 and 210 may be provided to adjust the control inputs for equalization stages 202.

Counter 204 may be an up/down counter that is capable of selectively incrementing or decrementing an n-bit counter value over a range of $2^n$ values. Counter 204 may increment or decrement the counter value based on the output of comparator 212. In some embodiments, the counter value may be monotonically increasing with the gain of the data signal. In this approach, counter 204 may increment the counter value when it receives an up control signal. In some embodiments, the counter value may be monotonically decreasing with the gain of the data signal. In this approach, counter 204 may decrement the counter value when it receives an up control signal.

Counter 204 may also receive a clock signal that determines the rate at which equalization circuitry 200 compensates for the attenuation of the data signal. For example, a counter 204 that adjusts the counter value once every two milliseconds cannot compensate for the attenuation of the data signal as quickly as a counter 204 that adjusts the counter value once every millisecond. In some embodiments, counter 204 may be rising-edge aligned. In this approach, counter 204 is be enabled to increment or decrement the counter value at rising edges of the clock signal. In some embodiments, counter 204 may be falling-edge aligned. In this approach, counter 204 is enabled to increment or decrement the counter value at falling edges of the clock signal.

In some embodiments, counter 204 may be programmable. Counter 204 may be programmed to increment or decrement counter values of any suitable bit-length. For example, the user may program counter 204 to increment or decrement a 3-bit counter value or an 8-bit counter value. Counter 204 may increase the number of bits in the counter value by setting the added most significant bits of the counter value to zero. Counter 204 may decrease the number of bits in the counter value by removing the necessary number of least significant bits. In some embodiments, counter 204 may include configurable RAM that is configured to store a value that sets the number of bits in the counter value.

Counter 204 may include state machine 206. In some embodiments, state machine 206 may determine a counter value at which to initialize counter 204. Counter 204 may be initialized at any suitable counter value within the range of 0 to $2^n-1$. In some embodiments, state machine 206 may select a counter value that is close to the counter value that results in compensating for the attenuation of the data signal. For example, if a counter value of [0100111] produces the control input that compensates for the attenuation of the data signal, then state machine 206 may initialize the counter value at [1111111] because it would result in determining the correct control input faster than if the counter value were initialized at [0000000].

State machine 206 may also control the sequence in which counter 204 provides counter values to D/A converters 208 and 210. For example, state machine 206 may first allow D/A converter 208 to determine a control input for the equalization stage coupled to D/A converter 208, then allow D/A converter 210 to determine a control input for the equalization stage coupled to D/A converter 210. In another example, state machine 206 may allow the counter value for D/A converters 208 and 210 to be incremented or decremented a certain number of times before switching to the other D/A converter. Counter 204 may include memory for storing the last counter value for one or both of D/A converters 208 and 210 to allow state machine 206 to switch between D/A converters 208 and 210 without losing track of counter values. In this approach, the current counter value for one of D/A converters 208 and 210 may be stored in the memory while the other of D/A converters 208 and 210 may be retrieved from the memory.

State machine 206 may also adjust the resolution of counter 204 and D/A converters 208 and 210. In some embodiments, this adjustment may be performed to reduce the number of counter value adjustments required to calibrate equalization stages 202. For example, state machine 206 may add bits to the counter value to determine the bit values one at a time. State machine 206 may initially set the counter value size to one to determine which half of the output voltage range the correct control input for equalization stages 202 resides (e.g., the first half). State machine 206 may then increase the counter value size to two to determine which quadrant of the output voltage range the ideal control input for equalization stages 202 resides (e.g., the second half of the first half). State machine 206 may continue increasing the counter value size until the correct control input has been determined. This approach vastly reduces the number of counter value adjustments than traversing the range of counter values until the correct counter value is determined.

In some embodiments, state machine 206 may be configured to hold the counter value if the counter value has decremented to the lower extreme (e.g., [000] or [0000] or incremented to the upper extreme (e.g., or [1111]). In this approach, state machine 206 prevents counter 204 from resetting the counter value at the opposite extreme and re-traversing the entire range of counter values only to reach the same extreme. In some embodiments, state machine 206 may increase the number of bits in the counter value when the counter value has incremented or decremented to one of the extremes.

D/A converters 208 and 210 may each convert the counter value of counter 204 into an analog voltage whose value is within the range of two reference voltages. If more than two equalization stages 202 are present, additional D/A converters may be provided to produce control inputs for each equalization stage.

In some embodiments, D/A converters 208 and 210 are supplied with the same reference voltages. In some embodiments, D/A converters 208 and 210 may be supplied with different reference voltages to allow the equalization stages to insert zeros in different frequency ranges.

D/A converters 208 and 210 may be configured to receive as many bits as counter 204 produces. In some embodiments, D/A converters 208 and 210 may be programmable to convert any bit-length counter value of counter 204 into an analog voltage. In some embodiments, D/A converters 208 and 210 may include configurable RAM that stores a value that sets the resolution of the D/A converter.

D/A converters 208 and 210 may be configured to produce analog voltages in fixed increments within their respective reference voltages. The counter value input into the D/A converter indicates the analog output that is produced. For example, if a three-bit counter value is input into D/A converter 208, D/A converter 208 may be able to produce eight evenly-spaced analog outputs within the reference voltages. If the counter value is [010], the analog output is the third voltage from one of reference voltages, depending on how D/A converter 208 is configured. The D/A converter may be able to consistently and accurately reproduce analog outputs based on the counter values.

Hysteresis circuit 214 may be provided to control the rate of adaptation of equalization circuit 200. Hysteresis circuit 214 may receive a clock signal and the output from comparator 212. The output from comparator 212 may be routed to counter 204.

Unlike the output from comparator 212, hysteresis circuitry 214 may selectively provide the clock signal to counter 204. In particular, if the output of comparator 212 is unstable (i.e., the value of the output changes values frequently), then it is an indication that the control inputs are close to the correct control inputs for compensating for the attenuation of the data signal. If comparator 212 exhibits instability, it is likely that the correct control inputs cannot be obtained with the discrete analog voltage outputs provided by D/A converters 208 and 210. In this case, hysteresis circuit 214 may not provide the clock signal to counter 204 to prevent counter 204 from unnecessarily altering the control inputs for equalization stages 202. If the output of comparator is stable (i.e., the output has not changed for a predetermined number of clock cycles), then hysteresis circuit 214 may provide the clock signal to counter 204.

In some embodiments, hysteresis circuit 214 may also instruct state machine 206 to increase the resolution of counter 204 when instability is detected. This may allow D/A converters 208 and 210 to produce a more precise control input before discontinuing the adjustment of the control input.

The foregoing is merely illustrative of the principles of this invention and various modifications can be made by those skilled in the art without departing from the scope and spirit of the invention.

What is claimed is:

1. Circuitry for controlling the amount of gain provided to a data signal that has experienced attenuation, the circuitry comprising:

an equalization stage configured to provide a gain to the data signal, wherein the gain is responsive to a control signal;

a comparator configured to produce an output that indicates whether the gain is less than or more than the amount of gain that is necessary to compensate for the attenuation of the data signal;

a counter configured to adjust a counter value based on the output of the comparator;

hysteresis circuitry configured to selectively apply a clock signal to the counter; and a digital-to-analog converter configured to produce the control signal based on the counter value;

wherein:

the hysteresis circuitry controls application of the clock signal to the counter, to adjust the counter value at certain transitions in the clock signal, based on the output of the comparator over a predetermined plurality of clock cycles prior to application of the clock signal to the counter.

2. The circuitry of claim 1, wherein the hysteresis circuitry withholds application of the clock signal to the counter if the output of the comparator changes within the predetermined plurality of cycles of the clock signal.

3. The circuitry of claim 1, wherein the hysteresis circuitry applies the clock signal to the counter if the output of the comparator has not changed for the predetermined plurality of cycles of the clock signal.

4. The circuitry of claim 1, further comprising:

an additional equalization stage coupled to the equalization stage in series to provide additional gain, wherein the additional gain is responsive to an additional control signal; and an additional digital-to-analog converter configured to produce the additional control signal based on the counter value.

5. The circuitry of claim 4, wherein the counter further comprises a state machine configured to determine a sequence in which the digital-to-analog converter and the additional digital-to-analog converter receive the counter value.

6. The circuitry of claim 1, wherein the counter is programmable to control the number of bits in the counter value.

7. The circuitry of claim 1, wherein the digital-to-analog converter is programmable to control the resolution of the control signal.

8. The circuitry of claim 1, wherein the digital-to-analog converter is configured to receive two reference voltages to define a range of voltages for the control signal.

9. The circuitry of claim 1, wherein the comparator is programmable to define the amount of gain that is sufficient to compensate for the attenuation of the data signal.

10. A method for controlling the amount of gain provided to a data signal that has experienced attenuation comprising:

providing a gain to the data signal, wherein the amount of gain is responsive to a control signal;

determining if the gain is less than or more than the amount of gain that is necessary to compensate for the attenuation of the data signal;

adjusting a counter value for a counter, based on whether the gain is less than or more than the necessary amount of gain, by selective application of a clock signal to the counter; and using a digital-to-analog converter to produce the control signal based on the counter value; wherein:

the selective application of the clock signal, to adjust the counter value, occurs at certain transitions in the clock signal, based on a result of the determining over a predetermined plurality of clock cycles prior to application of the clock signal to the counter.

11. The method of claim 10, wherein the application of the clock signal to the counter is withheld if the result of the determining changes within the predetermined plurality of cycles of the clock signal.

12. The method of claim 10, wherein the application of the clock signal to the counter occurs if the result of the determining changes within the predetermined plurality of cycles of the clock signal.

13. The method of claim 10, further comprising producing an additional control signal for an additional equalization stage based on the counter value.

14. The method of claim 13, further comprising determining a sequence for using the counter value to produce the control signal and the additional control signal.

15. The method of claim 10, wherein the counter is programmable to control the number of bits in the counter value.

16. The method of claim 10, wherein the digital-to-analog converter is programmable to control resolution of the control signal.

17. The method of claim 10, further comprising receiving two reference voltages with the digital-to-analog converter to define a range of voltages for the control signal.

18. The method of claim 10, wherein the comparator is programmable to define the amount of gain that is sufficient to compensate for the attenuation of the data signal.

19. Circuitry for controlling gain provided to a data signal that has experienced attenuation, the circuitry comprising:

a plurality of equalization stages configured to provide the gain to the data signal, wherein the gain is responsive to control signals;

a comparator configured to produce an output that indicates whether the gain compensates for the attenuation of the data signal;

a plurality of digital-to-analog converters;

a circuit configured to adjust a counter value based on the output of the comparator and to determine a sequence in which the plurality of digital-to-analog converters receive the counter value; and hysteresis circuitry configured to selectively apply a clock signal to the circuit to further adjust the counter value; wherein:

the hysteresis circuitry controls application of the clock signal to the circuit, to adjust the counter value based on the output of the comparator over a predetermined plurality of clock cycles prior to application of the clock signal to the circuit; and the plurality of digital-to-analog converters are configured to produce the control signals based on the counter value.

20. The circuitry of claim 19 wherein the circuit comprises a counter and a state machine.

21. Circuitry for controlling gain provided to a data signal that has experienced attenuation, the circuitry comprising:

an equalization stage configured to provide the gain to the data signal, wherein the gain is responsive to a control signal;

a comparator configured to produce an output that indicates whether the gain compensates for the attenuation of the data signal;

a counter configured to adjust a counter value based on the output of the comparator;

hysteresis circuitry configured to selectively apply a clock signal to the counter to further adjust the counter value, wherein the hysteresis circuitry controls application of the clock signal to the counter, to adjust the counter value based on the output of the comparator over a predetermined plurality of clock cycles prior to application of the clock signal to the counter;

a plurality of digital-to-analog converters configured to produce the control signal based on the counter value; and a state machine configured to determine a sequence in which the plurality of digital-to-analog converters receive the counter value.

22. The circuitry of claim 21 further comprising an additional equalization stage to provide additional gain, wherein the additional gain is responsive to an additional control signal produced by the plurality of digital-to-analog converters.

23. The circuitry of claim 22 wherein the additional equalization stage and the equalization stage are coupled in series.

* * * * *